US012665551B2

(12) United States Patent
Chen

(10) Patent No.: US 12,665,551 B2
(45) Date of Patent: Jun. 23, 2026

(54) CLASS-D AMPLIFIER CIRCUIT

(71) Applicant: Richtek Technology Corporation, HsinChu (TW)

(72) Inventor: Yi-Kuang Chen, Taichung (TW)

(73) Assignee: RICHTEK TECHNOLOGY CORPORATION, Zhubei City (TW)

( * ) Notice: Subject to any disclaimer, the term of this patent is extended or adjusted under 35 U.S.C. 154(b) by 471 days.

(21) Appl. No.: 18/468,727

(22) Filed: Sep. 17, 2023

(65) Prior Publication Data

US 2024/0128933 A1      Apr. 18, 2024

(30) Foreign Application Priority Data

Oct. 7, 2022    (TW) .................................. 111138306

(51) Int. Cl.
*H03F 1/02*      (2006.01)
*H03F 3/217*      (2006.01)
(52) U.S. Cl.
CPC ......... *H03F 1/0233* (2013.01); *H03F 3/2173* (2013.01); *H03F 2200/351* (2013.01)
(58) Field of Classification Search
CPC . H03F 1/0233; H03F 3/2173; H03F 2200/351
USPC ....................................................... 330/253
See application file for complete search history.

(56) References Cited

U.S. PATENT DOCUMENTS

| | | | | |
|---|---|---|---|---|
| 5,594,386 | A * | 1/1997 | Dhuyvetter | ......... H03F 3/45076 330/253 |
| 10,778,160 | B2 * | 9/2020 | Butler | .................... H03F 3/2173 |
| 11,296,666 | B1 * | 4/2022 | Larsen | ..................... H03F 3/187 |
| 11,552,602 | B2 * | 1/2023 | Lee | ........................... H03F 1/26 |
| 2012/0182071 | A1 * | 7/2012 | Takei | .................. H03F 3/45192 330/253 |
| 2017/0019078 | A1 * | 1/2017 | Galal | .................. H03F 3/45475 |
| 2017/0070200 | A1 * | 3/2017 | Chang | ................. H03K 17/162 |
| 2021/0211109 | A1 | 7/2021 | Daigle et al. | |
| 2021/0359653 | A1 | 11/2021 | Lee et al. | |
| 2021/0367571 | A1 * | 11/2021 | Chang | ................. H03F 3/45076 |
| 2024/0368982 | A1 * | 11/2024 | Cooley | ............... G01V 11/002 |

* cited by examiner

*Primary Examiner* — Hafizur Rahman
(74) *Attorney, Agent, or Firm* — Tung & Associates

(57)      ABSTRACT

A class-D amplifier circuit includes an amplifier circuit, a PWM circuit, a power stage circuit, a pair of feedback circuits, and a common-mode control circuit. The amplifier circuit receives a differential input signal at differential input ends to generate a differential intermediate signal. The PWM circuit generates a PWM signal according to the differential intermediate signal. The power stage circuit generates a differential output signal at differential output ends according to the PWM signal. The common-mode control circuit controls first and second high bandwidth transconductance circuits according to the output common-mode voltage of the differential output signal, so as to generate first and second common-mode control currents, thereby providing a common-mode control signal at the differential input ends to regulate the input common-mode voltage of the differential input signal at a predetermined input common-mode level.

19 Claims, 12 Drawing Sheets

200

Tdin

Sin

Smid

Smid

PWM
Circuit
210

Spwm

Sramp

241

241'

244

245

245'

246

CLASS-D AMPLIFIER CIRCUIT

CROSS REFERENCE

The present invention claims priority to TW 111138306 filed on Oct. 7, 2022.

BACKGROUND OF THE INVENTION

Field of Invention

The present invention relates to an amplifier circuit, in particular to a class-D amplifier circuit.

Description of Related Art

Please refer to FIG. 1, which is a modular block diagram of a conventional class-D amplifier circuit 10. As shown in FIG. 1, the class-D amplifier circuit 10 includes an amplifier circuit 100, a pulse width modulation (PWM) circuit 110, a power stage circuit 120, and a pair of feedback circuits 130A and 130B, wherein a differential input signal Sin received by the amplifier circuit 100 includes an input common-mode voltage Vicm, and a differential output signal Sout outputted by the power stage circuit 120 includes an output voltage Voutp and an output voltage Voutn.

Please further refer to FIG. 2. FIG. 2 is a schematic waveform diagram of the class-D amplifier circuit 10, wherein the output differential-mode voltage Voutd is a difference of the output voltage Voutp minus the output voltage Voutn, and the output common-mode voltage Voutc is an average value between the output voltage Voutp and the output voltage Voutn. In general, the input common-mode voltage Vicm of the differential input signal Sin needs to be maintained at a low voltage value so as not to exceed the maximum rating voltage of the amplifier circuit 100 to cause damage to the amplifier circuit 100. Therefore, the so-called low voltage setting means that the voltage should not be higher than the maximum rating voltage of the amplifier circuit 100. However, under the influence of the differential output signal Sout which is fed back through the feedback circuits 130A and 130B, the input common-mode voltage Vicm is disturbed by the high voltage of the output common-mode voltage Voutc of the differential output signal Sout and cannot be maintained at the low voltage setting.

in view of the above-mentioned shortcomings of the prior art, the present invention proposes a class-D amplifier circuit to control the common-mode control current of the differential input signal Sin, so as to prevent the input common-mode voltage Vicm from being disturbed by the output common-mode voltage Voutc and maintain it at the low voltage setting.

SUMMARY OF THE INVENTION

From one perspective, the present invention provides a class-D amplifier circuit, comprising: an amplifier circuit, configured to receive a differential input signal at a pair of differential input ends, and amplifying and buffering the differential input signal to generate a differential relay signal; a pulse width modulation (PWM) circuit, configured to generate a PWM signal by pulse width modulation according to the differential relay signal; a power stage circuit, configured to switch a plurality of switches of the power stage circuit according to the PWM signal to generate a differential output signal at a pair of differential output ends; a pair of feedback circuits correspondingly coupled between the pair of differential input ends and the pair of differential output ends, wherein the feedback circuits have a same feedback resistance; and a common-mode control circuit, configured to control one of a first high-bandwidth transconductance circuit and a second high-bandwidth transconductance circuit according to an output common-mode voltage of the differential output signal to correspondingly generate a first common-mode control current and a second common-mode control current, so as to provide a common-mode control signal at the pair of differential input ends to regulate an input common-mode voltage of the differential input signal at a predetermined input common-mode level; wherein when the output common-mode voltage is not less than the predetermined input common-mode level, a current value of the first common-mode control current is a quotient obtained by dividing a difference between the output common-mode voltage and the predetermined input common-mode level by the feedback resistance, and when the output common-mode voltage is less than the predetermined input common-mode level, the current value of the first common-mode control current is zero; wherein when the output common-mode voltage is not greater than the predetermined input common-mode level, a current value of the second common-mode control current is a quotient obtained by dividing a difference between the predetermined input common-mode level and the output common-mode voltage by the feedback resistance, and when the output common-mode voltage is greater than the predetermined input common-mode level, the current value of the second common-mode control current is zero.

In one embodiment, the first high-bandwidth transconductance circuit comprises: a first transconductance circuit, including a first transconductance resistor and a first transconductance transistor, wherein the first transconductance resistor and the first transconductance transistor are configured as a first non-operational-amplifier transconductance circuit for generating a first transconductance current according to the differential output signal; a second transconductance circuit, including a second transconductance resistor and a second transconductance transistor, wherein the second transconductance resistor and the second transconductance transistor are configured as a second non-operational-amplifier transconductance circuit for generating a second transconductance current according to a direct-current (DC) voltage; a third transconductance circuit, including a first operational amplifier circuit, a third transconductance transistor, and a third transconductance resistor, wherein the first operational amplifier circuit, the third transconductance transistor, and the third transconductance resistor are configured to generate a third transconductance current according to a first reference voltage by feedback mechanism, wherein the first reference voltage is related to the DC voltage; and a fourth transconductance circuit, including a second operational amplifier circuit, a fourth transconductance transistor, and a fourth transconductance resistor, wherein the second operational amplifier circuit, the fourth transconductance transistor, and the fourth transconductance resistor are configured to generate a fourth transconductance current according to a second reference voltage by feedback mechanism, wherein the second reference voltage is related to the predetermined input common-mode level; wherein the first common-mode control current is generated according to a linear operation among the first transconductance current, the second transconductance current, the third transconductance current, and the fourth transconductance current; wherein the first transconductance current includes a first common-mode sub-transconductance current and a first transconductance transistor sub-current, wherein the first common-mode sub-transconductance current is positively related to the output common-mode voltage, and the first transconductance transistor sub-current is related to an electrical characteristic of the first transconductance transistor, wherein the second transconductance current includes a second transconductance transistor sub-current which serves to cancel the first transconductance transistor sub-current.

In one embodiment, an operating bandwidth of the third transconductance circuit is smaller than operating bandwidths of the first transconductance circuit and the second transconductance circuit, wherein the operating bandwidth of the third transconductance circuit is related to an operating bandwidth of the first operational amplifier circuit.

In one embodiment, the second high-bandwidth transconductance circuit comprises: the fourth transconductance circuit; a fifth transconductance circuit, including a fifth transconductance resistor and a fifth transconductance transistor, wherein the fifth transconductance resistor and the fifth transconductance transistor are configured as a third non-operational-amplifier transconductance circuit for generating a fifth transconductance current according to the differential output signal; and a sixth transconductance circuit, including a sixth transconductance resistor and a sixth transconductance transistor, wherein the sixth transconductance resistor and the sixth transconductance transistor are configured as a fourth non-operational-amplifier transconductance circuit for generating a sixth transconductance current according to the DC voltage; wherein the second common-mode control current is generated according to a linear operation among the fourth transconductance current, the fifth transconductance current, and the sixth transconductance current; wherein the fifth transconductance current includes a second common-mode sub-transconductance current and a fifth transconductance transistor sub-current, wherein the second common-mode sub-transconductance current is positively related to the output common-mode voltage, and the fifth transconductance transistor sub-current is related to an electrical characteristic of the fifth transconductance transistor, wherein the sixth transconductance transistor current includes a sixth transconductance transistor sub-current which serves to cancel the fifth transconductance transistor sub-current.

In one embodiment, an operating bandwidth of the fourth transconductance circuit is smaller than operating bandwidths of the fifth transconductance circuit and the sixth transconductance circuit, wherein the operating bandwidth of the fourth transconductance circuit is related to an operating bandwidth of the second operational amplifier circuit.

In one embodiment, the common-mode control circuit further comprises a linear operation circuit for performing linear operation on the first transconductance current, the second transconductance current, the third transconductance current, the fourth transconductance current, the fifth transconductance current, and the sixth transconductance current to generate the first common-mode control current, the second common-mode control current, and the common-mode control signal.

In one embodiment, a resistance of the first transconductance resistor is related to the feedback resistance, and the first transconductance resistor comprises a pair of sub-first transconductance resistors correspondingly coupled to the pair of differential output ends, and the first transconductance transistor is coupled between the first transconductance resistor and a low-potential power source; wherein a resistance of the second transconductance resistor is related to the feedback resistance, and the second transconductance resistor is coupled to a high-potential power source, and the second transconductance transistor is coupled between the second transconductance resistor and the low-potential power source, wherein the voltage of the high-potential power source is related to the DC voltage; wherein a resistance of the third transconductance resistor is related to the feedback resistance, and the third transconductance resistor is coupled between the first operational amplifier circuit and the low-potential power source; and wherein a resistance of the fourth transconductance resistor is related to the feedback resistance, and the fourth transconductance resistor is coupled between the second operational amplifier circuit and the low-potential power source.

In one embodiment, a resistance of the fifth transconductance resistor is related to the feedback resistance, and the fifth transconductance resistor includes a pair of sub-fifth transconductance resistors correspondingly coupled to the pair of differential output ends, and the fifth transconductance transistor is coupled between the fifth transconductance resistor and a high-potential power source, wherein the voltage of the high-potential power source is related to the DC voltage; and wherein a resistance of the sixth transconductance resistor is related to the feedback resistance, the sixth transconductance resistor is coupled to a low-potential power source, and the sixth transconductance transistor is coupled between the sixth transconductance resistor and the high-potential power source.

In one embodiment, the first transconductance current is proportional to a difference of the output common-mode voltage minus the voltage of the low-potential power source and further minus a gate-source voltage of the first transconductance transistor, and is inversely proportional to the feedback resistance; wherein the second transconductance current is proportional to a difference of the voltage of the high-potential power source minus the voltage of the low-potential power source and further minus a gate-source voltage of the second transconductance transistor, and is inversely proportional to the feedback resistance; wherein the third transconductance current is proportional to the voltage of the high-potential power source, and is inversely proportional to the feedback resistance; wherein the fourth transconductance current is proportional to the predetermined input common-mode level and is inversely proportional to the feedback resistance; wherein the fifth transconductance current is proportional to the difference of the voltage of the high-potential power source minus the output common-mode voltage and further minus a gate-source voltage of the fifth transconductance transistor, and is inversely proportional to the feedback resistance; and wherein the sixth transconductance current is proportional to a difference of the voltage of the high-potential power source minus the voltage of the low-potential power source and further minus a gate-source voltage of the sixth transconductance transistor, and is inversely proportional to the feedback resistance.

In one embodiment, the second transconductance current includes a second sub-transconductance current, and a component of the third transconductance current which is related to a voltage of the high-potential power source and a component of the second sub-transconductance current which is related to the voltage of the high-potential power source cancel each other; wherein the fifth transconductance current includes a fifth sub-transconductance current and the sixth transconductance current includes a sixth sub-transconductance current, and a component of the fifth transconductance current which is related to the voltage of the high-potential power source and a component of the sixth sub-transconductance current which is related to the voltage of the high-potential power source cancel each other.

In one embodiment, one of the pair of sub-first transconductance resistors and the first transconductance transistor are connected in series with each other between a positive output end of the pair of differential output ends and the low-potential power source, and the other of the pair of sub-first transconductance resistors and the first transconductance transistor are connected in series with each other between a negative output end of the pair of differential output ends and the low-potential power source.

In one embodiment, one of the pair of sub-fifth transconductance resistors and the fifth transconductance transistor are connected in series with each other between a positive output end of the pair of differential output ends and the high-potential power source, and the other of the pair of sub-fifth transconductance resistors and the fifth transconductance transistor are connected in series with each other between a negative output end of the pair of differential output ends and the high-potential power source.

In one embodiment, the first transconductance transistor and the second transconductance transistor are both diode-coupled MOS transistors.

In one embodiment, the fifth transconductance transistor and the sixth transconductance transistor are both diode-coupled MOS transistors.

In one embodiment, the fourth transconductance circuit further comprises a current mirror circuit, and the current mirror circuit is coupled with the fourth transconductance transistor to replicate the fourth transconductance current, for providing the fourth transconductance current to the linear operation circuit.

In one embodiment, a first capacitor is coupled between a gate of the first transconductance transistor and the pair of differential output ends.

In one embodiment, a second capacitor is coupled between a gate of the fifth transconductance transistor and the pair of differential output ends.

In one embodiment, the linear operation circuit performs linear operation on the first transconductance current in positive sign, the second transconductance current in negative sign, the third transconductance current in positive sign, and the fourth transconductance current in negative sign to generate the first common-mode control current, and when the output common-mode voltage is less than the predetermined input common-mode level, the current value of the first common-mode control current is set to zero.

In one embodiment, the linear operation circuit performs linear operation on the linear operation circuit performs linear operation on the first transconductance current in positive sign, the second transconductance current in negative sign, the third transconductance current in positive sign, and the fourth transconductance current in negative sign to generate the first common-mode control current, and when the output common-mode voltage is less than the predetermined input common-mode level, the current value of the first common-mode control current is set to zero.

The objectives, technical details, features, and effects of the present invention will be better understood with regard to the detailed description of the embodiments below, with reference to the attached drawings.

DESCRIPTION OF THE PREFERRED
EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1:
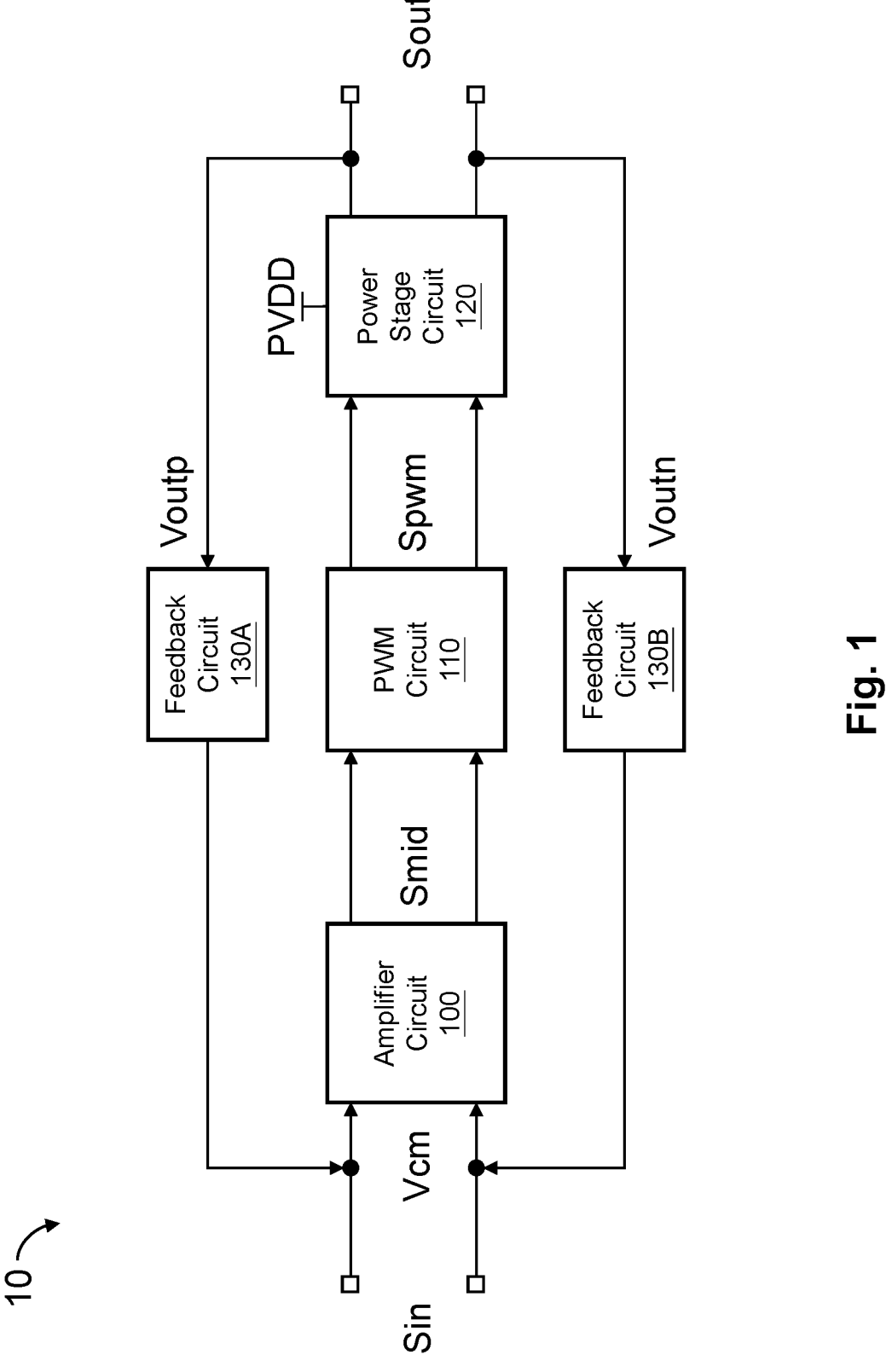
FIG. 1 is a modular block diagram of a conventional class-D amplifier circuit.
Figure 2:
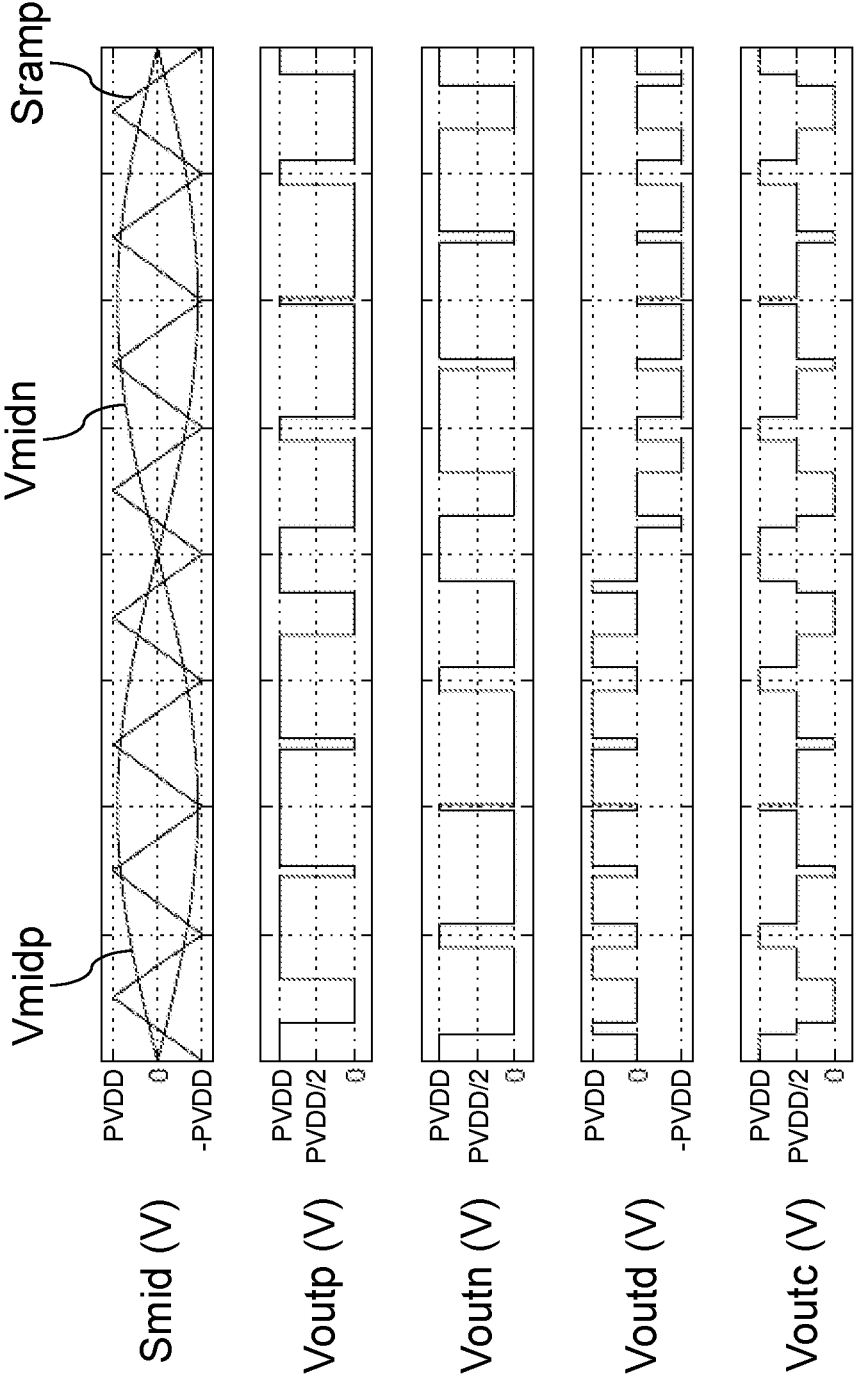
FIG. 2 is a schematic waveform diagram of the conventional class-D amplifier circuit.
Figure 3:
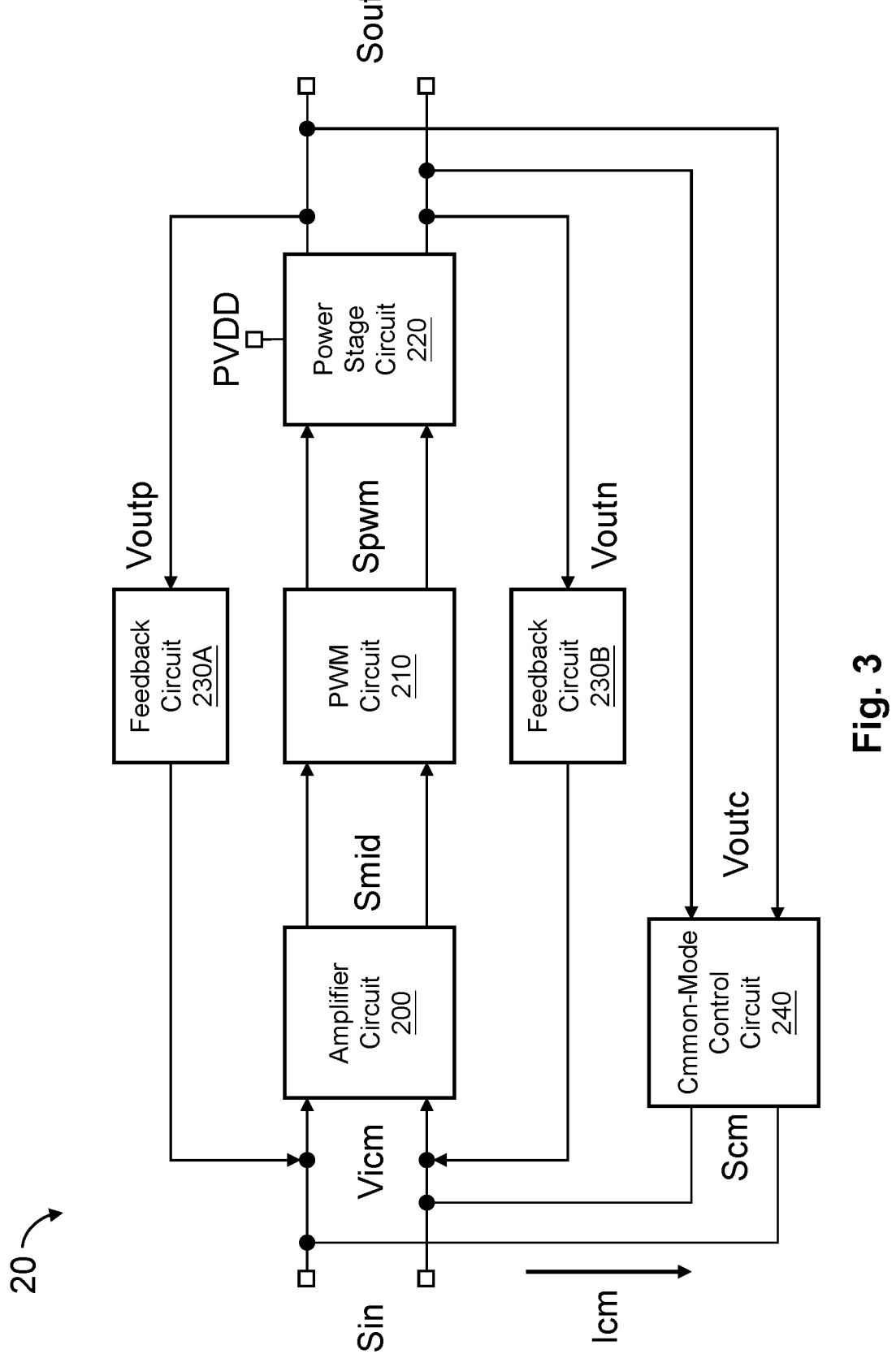
FIG. 3 is a modular block diagram of a class-D amplifier circuit according to an embodiment of the present invention.

Please refer to FIG. 3, which is a modular block diagram of the class-D amplifier circuit 20 according to an embodiment of the present invention. As shown in FIG. 3, the class-D amplifier circuit 20 includes an amplifier circuit 200, a pulse width modulation (PWM) circuit 210, a power stage circuit 220, a pair of feedback circuits 230A and 230B, and a common-mode control circuit 240. The respective structures, functions and the cooperation of the amplifier circuit 200, the PWM circuit 210, the power stage circuit 220, feedback circuits 230A, 230B, and the common-mode control circuit 240 will be explained in detail below.

Figure 4:
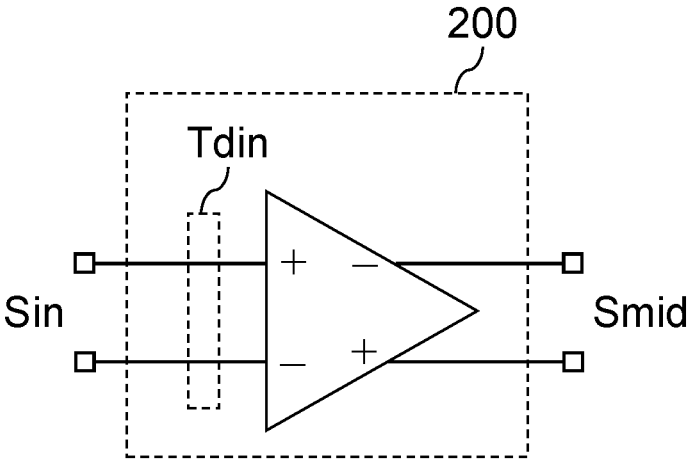
FIG. 4 is a schematic circuit diagram of an amplifier circuit according to an embodiment of the present invention.

Please refer to FIG. 4, which is a schematic circuit diagram of the amplifier circuit 200 according to an embodiment of the present invention. As shown in FIG. 4, in some embodiments, the amplifier circuit 200 is configured to receive a differential input signal Sin at a pair of differential input ends Tdin, and amplify and buffer the differential input signal Sin to generate a differential relay Signal Smid. In some embodiments, the amplifier circuit 200 is a differential amplifier, wherein the differential amplifier has a pair of input ends and a pair of output ends. The structure and function of a differential amplifier are well known to those with ordinary knowledge in the technical field to which the present invention pertains, and thus are not explained in detail herein.

Figure 5:
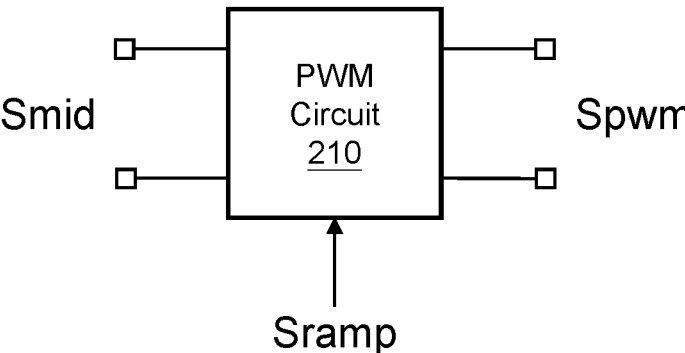
FIG. 5 is a schematic circuit diagram of a pulse width modulation (PWM) circuit according to an embodiment of the present invention.

Please refer to FIG. 5, which is a schematic circuit diagram of the PWM circuit 210 according to an embodiment of the present invention. As shown in FIG. 5, in some embodiments, the PWM circuit 210 is configured to generate a PWM signal Spwm by pulse width modulation according to the differential relay signal Smid, wherein the structure and function of a PWM circuit and how pulse width modulation operates are well known to those skilled in the art to which the present invention pertains, and thus are not explained in detail herein.

Figure 6:
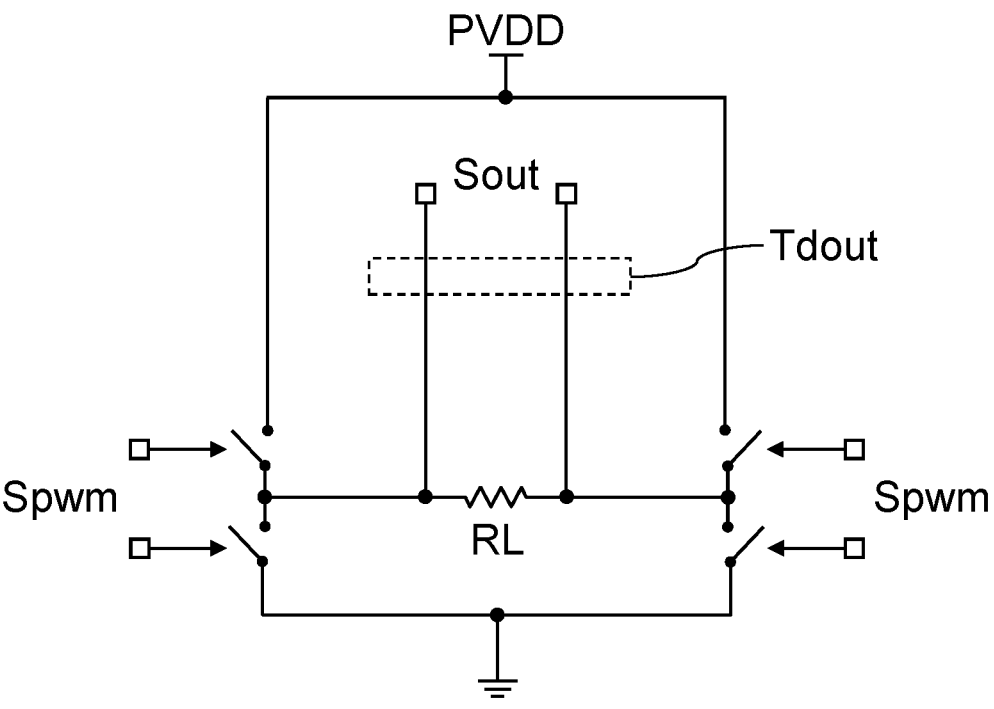
FIG. 6 is a schematic circuit diagram of a power stage circuit according to an embodiment of the present invention.

Please refer to FIG. 6, which is a schematic circuit diagram of the power stage circuit 220 according to an embodiment of the present invention. As shown in FIG. 6, in some embodiments, the power stage circuit 220 is configured to operate switches of the power stage circuit 220 according to the PWM signal Spwm to generate a differential output signal Sout at a pair of differential output ends Tdout, wherein the pair of differential output ends Tdout are coupled to a load resistor RL (which for example belongs to a speaker). In some embodiments, the power stage circuit 220 is an H-bridge circuit, wherein the structure and function of an H-bridge circuit are well known to those skilled in the art to which the present invention pertains, and thus are not explained in detail herein.

Figure 7:
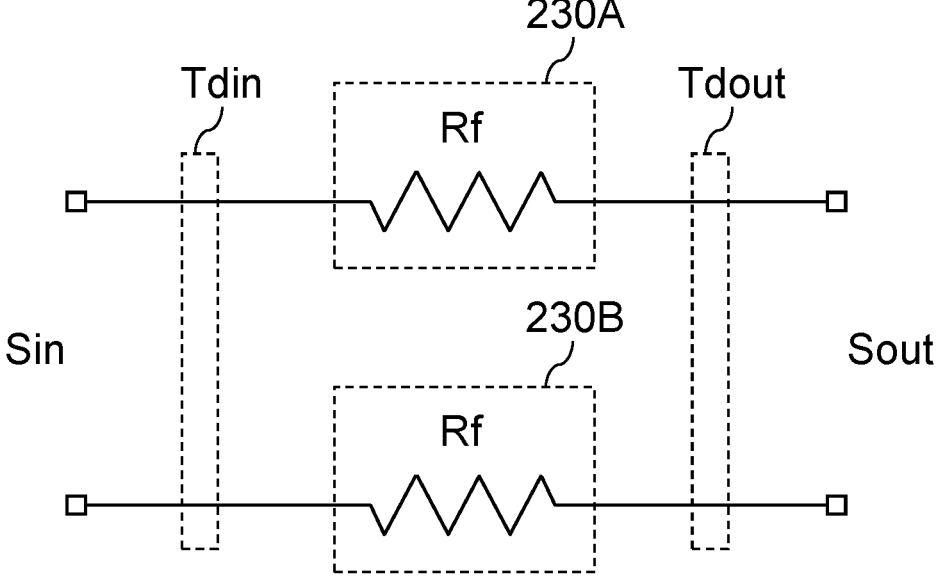
FIG. 7 is a schematic circuit diagram of a feedback circuit according to an embodiment of the present invention.

Please refer to FIG. 7, which is a schematic circuit diagram of the feedback circuits 230A and 230B according to an embodiment of the present invention. As shown in FIG. 7, in some embodiments, the feedback circuits 230A and 230B are respectively coupled between the differential input ends Tdin and the differential output ends Tdout, and the feedback circuits 230A and 230B have the same feedback resistance Rf. In some embodiments, the feedback circuits 230A and 230B are configured to feedback the differential output signal Sout of the differential output ends Tdout to the differential input ends Tdin, wherein the output common-mode voltage Voutc of the differential output signal Sout generates a current (hereinafter referred to as "feedback current") to the differential input ends Tdin through the feedback circuits 230A and 230B. The structures and functions of the feedback circuits 230A and 230B are well known to those with ordinary knowledge in the technical field to which the present invention pertains, and thus are not explained in detail herein.

Figure 8:
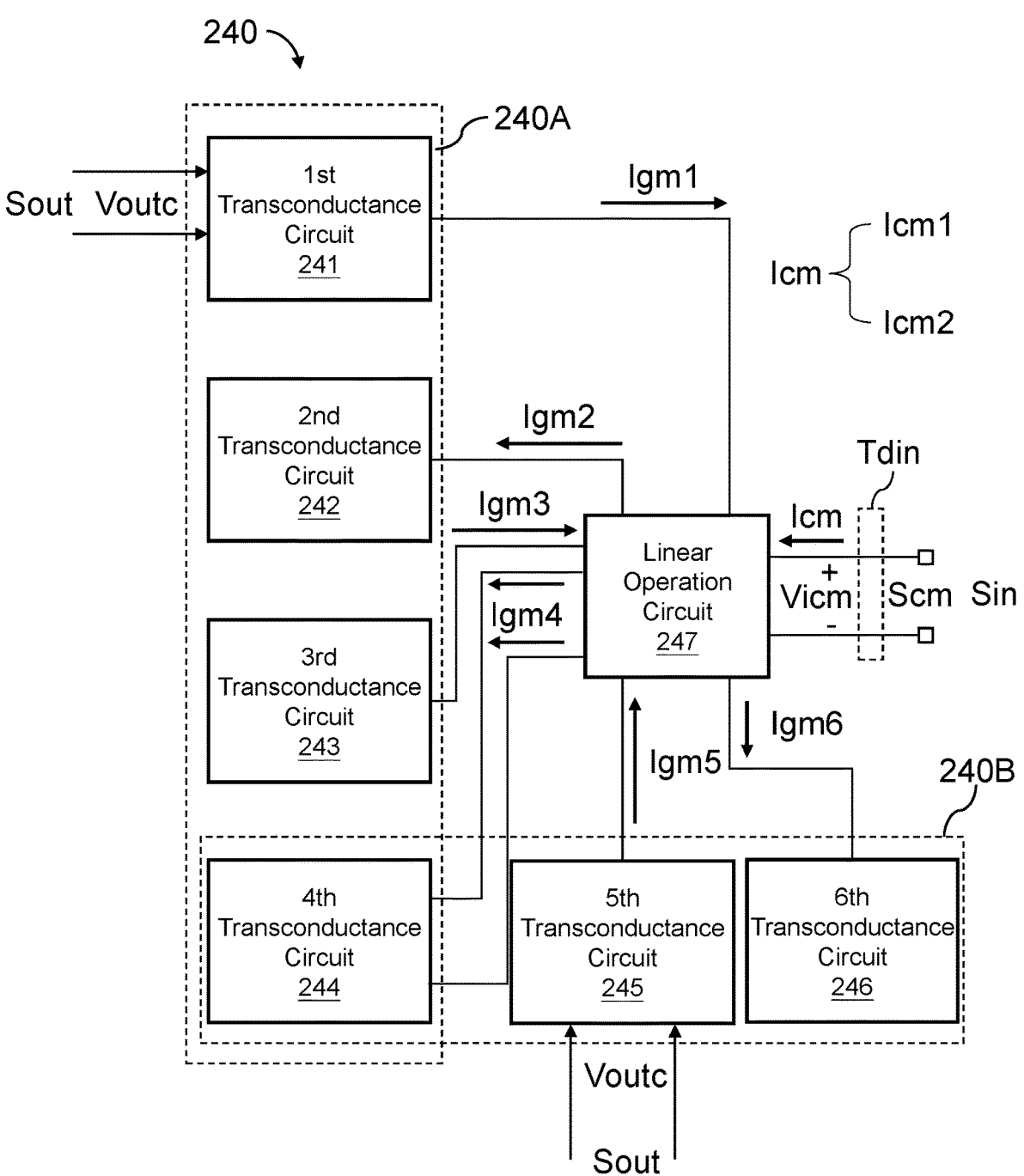
FIG. 8 is a modular block diagram of a common-mode control circuit according to an embodiment of the present invention.

Please refer to FIG. 8. FIG. 8 is a block diagram of the common-mode control circuit 240 according to an embodiment of the present invention, wherein the common-mode control circuit 240 is configured to control one of a first high-bandwidth transconductance circuit 240A and a second high-bandwidth transconductance circuit 240B according to the output common-mode voltage Voutc of the differential output signal Sout to generate a corresponding first common-mode control current Icm1 and a second common-mode control current Icm2, so as to provide a common-mode control signal Scm at the pair of differential input ends Tdin to regulate an input common-mode voltage Vicm of the differential input signal Sin at a predetermined input common-mode level Vcm. As shown in FIG. 8, in some embodiments, the first high-bandwidth transconductance circuit 240A includes a first transconductance circuit 241, a second transconductance circuit 242, a third transconductance circuit 243, and a fourth transconductance circuit 244, and the second high-bandwidth transconductance circuit 240B includes the fourth transconductance circuit 244, a fifth transconductance circuit 245, and a sixth transconductance circuit 246. The respective structures and functions of the first transconductance circuit 241, the second transconductance circuit 242, the third transconductance circuit 243, the fourth transconductance circuit 244, the fifth transconductance circuit 245, and the sixth transconductance circuit 246 and their cooperation will be explained in detail below. It should be noted that the so-called "high-bandwidth" refers to a bandwidth which is relatively higher than the operating bandwidth of an operational amplifier; that is, the bandwidth of the signals received by the first high-bandwidth transconductance circuit 240A and the second high-bandwidth transconductance circuit 240B are at least ten times higher than that of the signal received by the general operational amplifier. Adopting the first high-bandwidth transconductance circuit 240A and the second high-bandwidth transconductance circuit 240B with high-bandwidth can reduce the noises caused by high-bandwidth signals, as compared to adopting an operational amplifier.

Figure 9A:
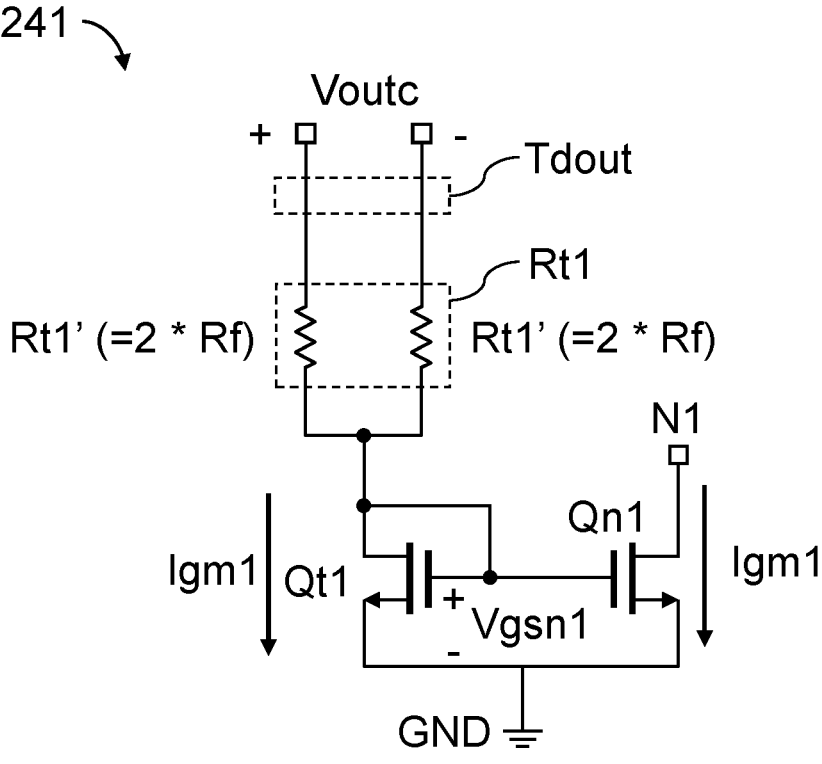
FIG. 9A is a schematic circuit diagram of the first transconductance circuit according to an embodiment of the present invention.

Please refer to FIG. 9A, which is a schematic circuit diagram of the first transconductance circuit 241 according to an embodiment of the present invention. As shown in FIG. 9A, the first transconductance circuit 241 includes a first transconductance resistor Rt1 and a first transconductance transistor Qt1, wherein the first transconductance resistor Rt1 and the first transconductance transistor Qt1 are configured as a transconductance circuit, which is not an operational amplifier, for generating a first transconductance current Igm1 according to the output common-mode voltage Voutc of the differential output signal Sout. The first transconductance circuit 241 replicates and generates the first transconductance current Igm1 by means of a current mirror composed of a transistor Qn1 and the transconductance transistor Qt1, wherein the structure and function of a current mirror are well known to those skilled in the art to which the present invention pertains, and thus are not explained in detail herein. In some embodiments, the resistance of the first transconductance resistor Rt1 is related to the feedback resistance Rf; the first transconductance resistor Rt1 includes a pair of sub-first transconductance resistors Rt1' correspondingly coupled to the pair of differential output ends Tdout; and the first transconductance transistor Qt1 is coupled between the first transconductance resistor Rt1 and a low-potential power source (such as but not limited to the ground potential GND as shown in FIG. 9A). In some embodiments, as shown in FIG. 9A, the resistance of each of the pair of sub-first transconductance resistors Rt1' is equal to twice of the feedback resistance Rf, wherein one of the pair of sub-first transconductance resistors Rt1' and the first transconductance transistor Qt1 are connected in series with each other between a positive output end of the pair of differential output ends Tdout and the low-potential power source, and the other of the pair of sub-first transconductance resistors Rt1' and the first transconductance transistor Qt1 are connected in series with each other between a negative output end of the pair of differential output ends Tdout and the low-potential power source.

In some embodiments, the first transconductance current Igm1 is proportional to a difference which is obtained by the output common-mode voltage Voutc minus the voltage of the low-potential power source (for example, the ground potential GND, which is 0 voltage) and further minus a gate-source voltage Vgsn1 of the transconductance transistor Qt1, and is inversely proportional to the feedback resistance Rf. In one embodiment, the current value of the first transconductance current Igm1 is shown as equation 1.

$$Igm1=(Voutc-Vgsn1-GND)/Rf=(Voutc-Vgsn1)/Rf \qquad \text{Equation 1:}$$

Figure 9B:
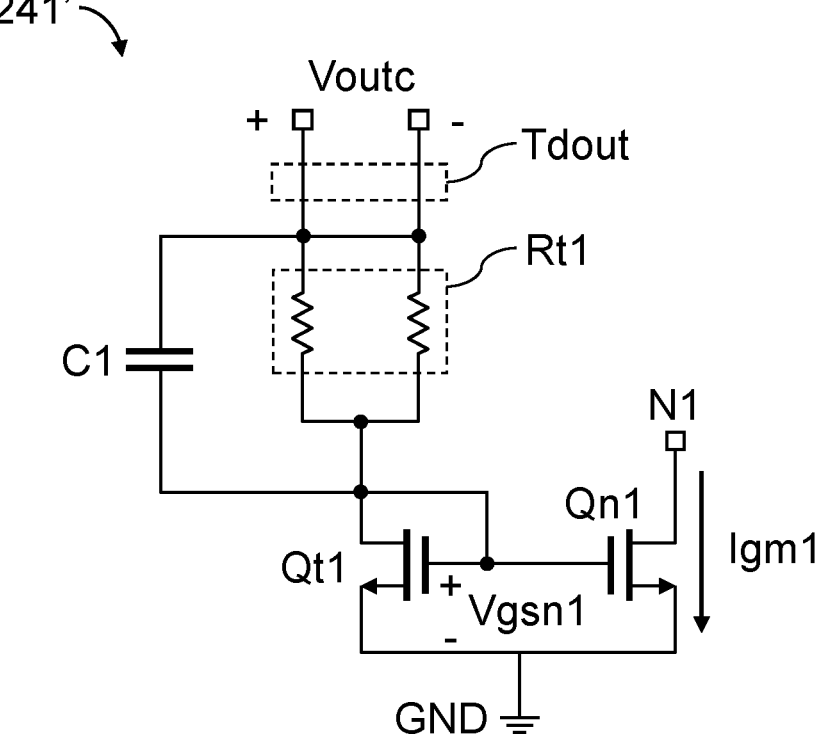
FIG. 9B is a schematic circuit diagram of the first transconductance circuit according to another embodiment of the present invention.

Please refer to FIG. 9B, which is a schematic circuit diagram of the first transconductance circuit 241' according to another embodiment of the present invention. The embodiment of FIG. 9B is different from the first transconductance circuit 241 in FIG. 9A in that a first capacitor C1 is coupled between the gate of the first transconductance transistor Qt1 of the first transconductance circuit 241' and the pair of the differential output ends Tdout, wherein the first capacitor C1 serves to eliminate the negative influence of the parasitic capacitance of the first transconductance transistor Qt1 at high frequencies. The mechanism of a parasitic capacitance is well known to those with ordinary knowledge in the technical field to which the present invention pertains, so it is not explained in detail herein.

The "transconductance circuit which is not an operational amplifier" is also referred to in this specification as "non-operational-amplifier transconductance circuit". It should be noted that such "non-operational-amplifier transconductance circuit" refers to a transconductance circuit that does not use an operational amplifier to receive the output common-mode voltage Voutc of the differential output signal Sout (or its related signal) for generating an output signal to regulate the input common-mode voltage Vicm of the differential input signal Sin at a predetermined input common-mode level Vcm. This is because an operational amplifier has relatively larger noises when processing high-bandwidth signals, and therefore cannot accurately adjust the input common-mode voltage Vicm to a stable constant value in response to the fast changes of the differential output signal Sout. For the above reason, the present invention adopts a "non-operational-amplifier transconductance circuit", which is for example a combination of a resistor and a transistor as shown in FIG. 9A and in other embodiments, with high processing bandwidth. More specifically, when it is necessary to process a fast changing signal, a "non-operational-amplifier transconductance circuit" is preferably adopted; however when processing a signal with a fixed value, a transconductance circuit with an operational amplifier can be adopted.

Figure 10:
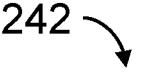
FIG. 10 is a schematic circuit diagram of the second transconductance circuit according to an embodiment of the present invention.
Figure 10:
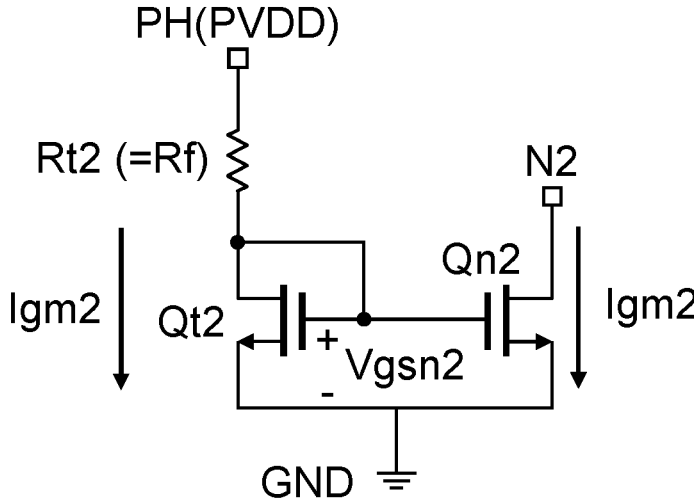

Please refer to FIG. 10, which is a schematic circuit diagram of the second transconductance circuit 242 according to an embodiment of the present invention. As shown in FIG. 10, the second transconductance circuit 242 includes a second transconductance resistor Rt2 and a second transconductance transistor Qt2, wherein the second transconductance resistor Rt2 and the second transconductance transistor Qt2 are configured as a non-operational-amplifier transconductance circuit for generating a second transconductance current Igm2 according to a direct-current (DC) voltage PVDD (for example, 20 volts) having a higher voltage value as compared to a maximum output differential-mode voltage Voutd. The second transconductance circuit 242 replicates the second transconductance current Igm2 through a current mirror composed of a transistor Qn2 and a second transconductance transistor Qt2. In some embodiments, the resistance of the second transconductance resistor Rt2 is related to the feedback resistance Rf; for example, as shown in FIG. 10, the resistance of the second transconductance resistor Rt2 is equal to the feedback resistance Rf. The second transconductance resistor Rt2 is coupled to a high-potential power source PH (such as a DC voltage PVDD shown in FIG. 10), and the second transconductance transistor Qt2 is coupled between the second transconductance resistor Rt2 and a low-potential power source (such as the ground potential GND shown in FIG. 10), wherein the voltage of the high-potential power source PH is related to the DC voltage PVDD.

In some embodiments, the second transconductance current Igm2 is proportional to a difference of the voltage of the high-potential power source PH (for example, the DC voltage PVDD) minus the voltage of the low-potential power source (for example, the ground potential GND which is 0 voltage and further minus a gate-source voltage Vgsn2 of the second transconductance transistor Qt2, and is inversely proportional to the feedback resistance Rf. In one embodiment, the current value of the second transconductance current Igm2 is shown as equation 2. The purpose of providing the second transconductance circuit 242 is to provide the gate-source voltage Vgsn2 of the second transconductance transistor Qt2 which is equal to the gate-source voltage Vgsn1 of the first transconductance transistor Qt1 under normal operation, so that when calculating the first common-mode control current Icm1, the first transconductance transistor sub-current of the first transconductance current Igm1 can be cancelled, which will be explained in detail later.

$$Igm2=(PVDD-Vgsn2-GND)=(PVDD-Vgsn2)/Rf \qquad \text{Equation 2:}$$

Figure 11:
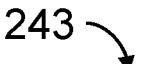
FIG. 11 is a schematic circuit diagram of the third transconductance circuit according to an embodiment of the present invention.
Figure 11:
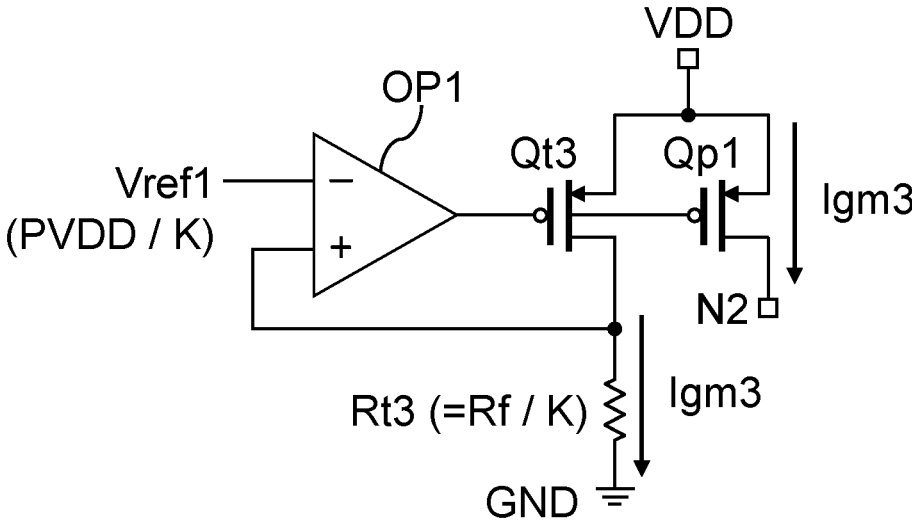

Please refer to FIG. 11. FIG. 11 is a schematic circuit diagram of the third transconductance circuit 243 according to an embodiment of the present invention. As shown in FIG. 11, the third transconductance circuit 243 includes a first operational amplifier circuit OP1, a third transconductance transistor Qt3, and a third transconductance resistor Rt3, wherein the first operational amplifier circuit OP1, the third transconductance transistor Qt3, and the third transconductance resistor Rt3 are configured to generate a third transconductance current Igm3 according to a first reference voltage Vref1 by feedback mechanism. In some embodiments, the third transconductance circuit 243 generates a current which is the same as the third transconductance current Igm3 through a transistor Qp1, wherein the gate-source voltage of the transistor Qp1 is the same as the gate-source voltage of the third transconductance transistor Qt3, and both the transistor Qp1 and the third transconductance transistor Qt3 operate in saturation region. In some embodiments, the first reference voltage Vref1 is related to the DC voltage PVDD, wherein the value of the first reference voltage Vref1 is, for example, the DC voltage PVDD divided by a scaling factor K, so that the value of the first reference voltage Vref1 is less than or equal to the value of a power supply voltage VDD, to prevent the third transconductance circuit 243 from being damaged during operation. In some embodiments, the resistance of the third transconductance resistor Rt3 is related to the feedback resistance Rf, and the third transconductance resistor Rt3 is coupled between the first operational amplifier circuit OP1 and the low-potential power source (for example, the ground potential GND shown in FIG. 11), wherein the resistance of the third transconductance resistor Rt3 is, for example as shown in FIG. 11, the feedback resistance Rf divided by a scaling factor K.

In some embodiments, the third transconductance current Igm3 is proportional to the voltage of the high-potential power source PH (such as the DC voltage PVDD), and is inversely proportional to the feedback resistance Rf. In one embodiment, the current value of the third transconductance current Igm3 is shown as equation 3. In some embodiments, the operating bandwidth of the third transconductance circuit 243 is smaller than the operating bandwidths of the first transconductance circuit 241 and the second transconductance circuit 242, wherein the operating bandwidth of the third transconductance circuit 243 is related to the operating bandwidth of the operational amplifier circuit OP1.

$$Igm3=(PVDD/K)/(Rf/K)=PVDD/Rf \qquad \text{Equation 3:}$$

Figure 12:
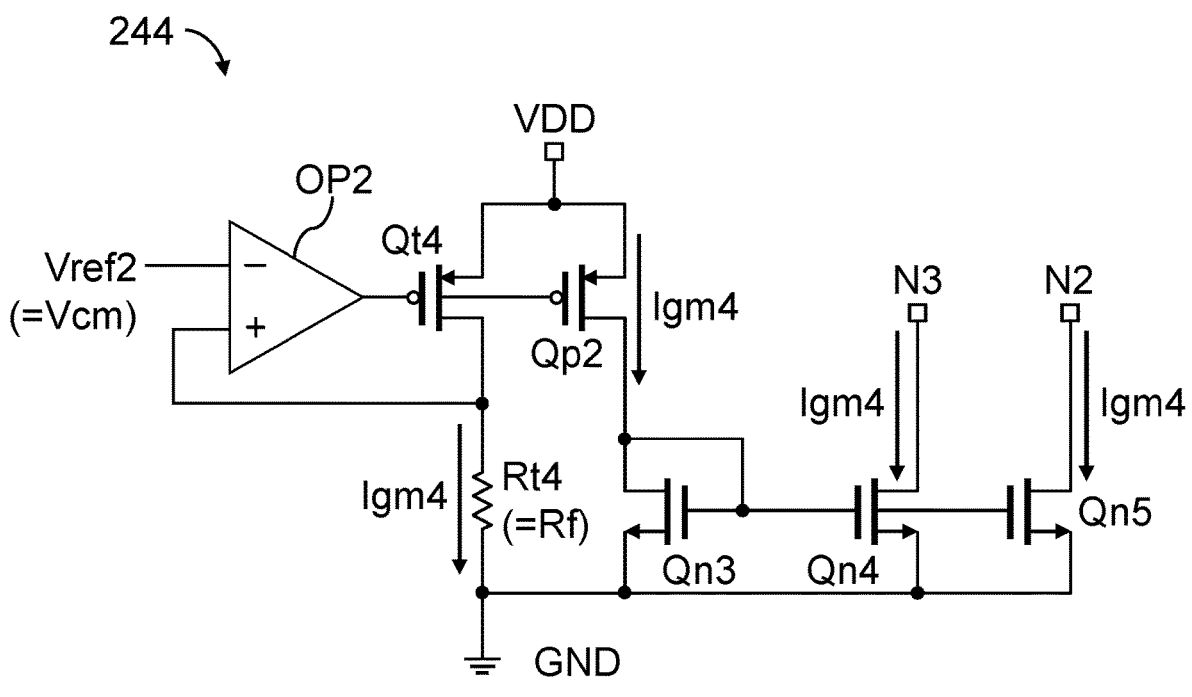
FIG. 12 is a schematic circuit diagram of the fourth transconductance circuit according to an embodiment of the present invention.

Please refer to FIG. 12, which is a schematic circuit diagram of the fourth transconductance circuit 244 according to an embodiment of the present invention. As shown in FIG. 12, the fourth transconductance circuit 244 includes a second operational amplifier circuit OP2, a fourth transconductance transistor Qt4, and a fourth transconductance resistor Rt4, wherein the second operational amplifier circuit OP2, the fourth transconductance transistor Qt4, and the fourth transconductance resistor Rt4 are configured to generate a fourth transconductance current Igm4 according to a second reference voltage Vref2 by feedback mechanism. In some embodiments, the fourth transconductance circuit 244 generates a current which is the same as the fourth transconductance current Igm4 through a transistor Qp2, wherein the gate-source voltage of the transistor Qp2 is the same as the gate-source voltage of the fourth transconductance transistor Qt4, and both the transistor Qp2 and the fourth transconductance transistor Qt4 operate in saturation region. In some embodiments, the second reference voltage Vref2 is related to a predetermined input common-mode level Vcm (for example, as shown in FIG. 12, the second reference voltage Vref2 is equal to the predetermined input common-mode level Vcm), wherein the value of the predetermined input common-mode level Vcm is less than or equal to the value of the power supply voltage VDD. In some embodiments, the resistance of the fourth transconductance resistor Rt4 is related to the feedback resistance Rf (for example, as shown in FIG. 12, the resistance of the fourth transconductance resistor Rt4 is equal to the feedback resistance Rf), and the fourth transconductance resistor Rt4 is coupled between the second operational amplifier circuit OP2 and the low-potential power source (for example, the ground potential GND shown in FIG. 12).

In some embodiments, the fourth transconductance circuit 244 further includes a current mirror circuit, the current mirror circuit is coupled to the fourth transconductance transistor Qt4 to replicate the fourth transconductance current Igm4. In the present embodiment, the current mirror circuit includes plural transistors Qn3, Qn4, and Qn5. The transistor Qn3, the transistor Qn4, and the transistor Qn5 respectively form plural current mirrors to replicate and generate plural fourth transconductance currents Igm4. In the present embodiment, the current mirror circuits formed by the plurality transistors Qn3, Qn4, and Qn5 generate two fourth transconductance currents Igm4, which are respectively used to form the first common-mode control current Icm1 and the second common-mode control current Icm2.

In some embodiments, the fourth transconductance current Igm4 is proportional to the predetermined input common-mode level Vcm, and is inversely proportional to the feedback resistance Rf. In one embodiment, the current value of the fourth transconductance current Igm4 is shown as equation 4.

$$Igm4=Vcm/Rf \qquad \text{Equation 4:}$$

In some embodiments, the first common-mode control current Icm1 is generated according to a linear operation among the first transconductance current Igm1, the second transconductance current Igm2, the third transconductance current Igm3, and the fourth transconductance current Igm4. The first transconductance current Igm1 includes a first common-mode sub-transconductance current and a first transconductance transistor sub-current. The first common-mode sub-transconductance current is positively related to the output common-mode voltage Voutc (corresponding to Voutc/Rf in equation 1), and the first transconductance transistor sub-current is related to an electrical characteristic of the first transconductance transistor Qt1 (corresponding to Vgsn1/Rf in equation 1). The second transconductance current Igm2 includes a second transconductance transistor sub-current (corresponding to Vgsn2/Rf in equation 2) which serves to cancel the first transconductance transistor sub-current (by setting the gate-source voltage Vgsn2 of the second transconductance transistor Qt2 to be equal to the gate-source voltage Vgsn1 of the first transconductance transistor Qt1). In some embodiments, the current value of the first common-mode control current Icm1 is shown as equation 5, wherein the first transconductance transistor sub-current of the first transconductance current Igm1 and the second transconductance transistor sub-current of the second transconductance current Igm2 cancel each other.

$$Icm1 = Igm1 - Igm2 + Igm3 - Igm4 = \qquad \text{Equation 5}$$
$$\frac{Voutc - Vgsn1}{Rf} - \frac{PVDD - Vgsn2}{Rf} + \frac{PVDD}{Rf} - \frac{Vcm}{Rf} \rightarrow$$
$$Icm2 = (Voutc - Vem)/Rf$$

Figure 13A:
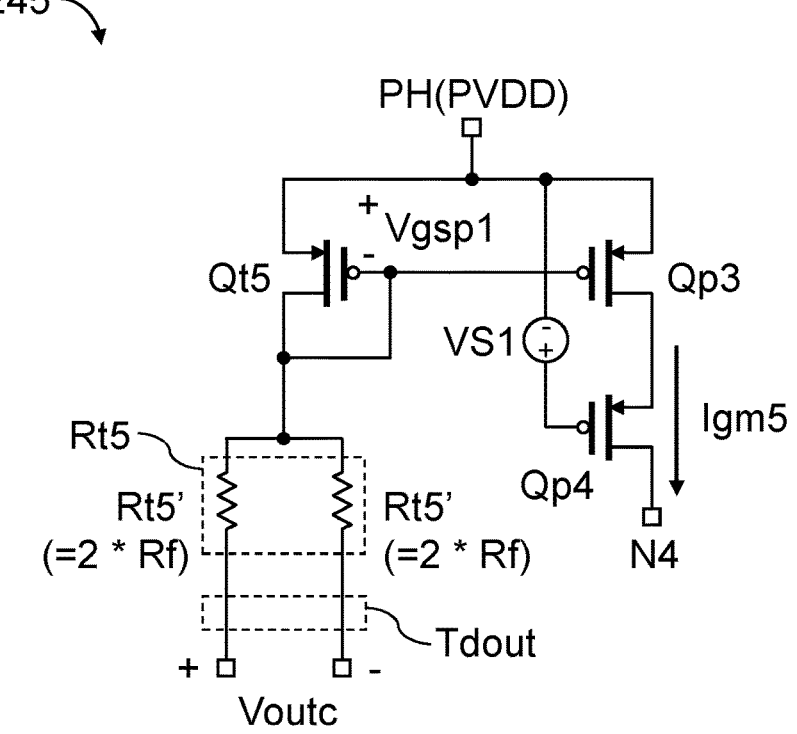
FIG. 13A is a schematic circuit diagram of the fifth transconductance circuit according to an embodiment of the present invention.

Please refer to FIG. 13A. FIG. 13A is a schematic circuit diagram of the fifth transconductance circuit 245 according to an embodiment of the present invention. As shown in FIG. 13A, the fifth transconductance circuit 245 includes a fifth transconductance resistor Rt5 and a fifth transconductance transistor Qt5. The fifth transconductance resistor Rt5 and the fifth transconductance transistor Qt5 are configured as a non-operational-amplifier transconductance circuit for generating a fifth transconductance current Igm5 according to the output common-mode voltage Voutc of the differential output signal Sout, wherein the fifth transconductance circuit 245 replicates and generates the fifth transconductance current Igm5 through a current mirror composed of a transistor Qp3 and a fifth transduction transistor Qt5. In some embodiments, the resistance of the fifth transconductance resistor Rt5 is related to the feedback resistance Rf, and the fifth transconductance resistor Rt5 includes a pair of sub-fifth transconductance resistors Rt5' correspondingly coupled to the pair of differential output ends Tdout, and the fifth transconductance transistor Qt5 is coupled between the fifth transconductance resistor Rt5 and the high-potential power source PH, wherein the voltage of the high-potential power source PH is related to the DC voltage PVDD (for example, the voltage of the high-potential power source PH is equal to the DC voltage PVDD). In some embodiments, the resistance of each of the sub-fifth transconductance resistors Rt5' is equal to twice of the feedback resistance Rf; and, one of the pair of sub-fifth transconductance resistors Rt5' and the fifth transconductance transistor Qt5 are connected in series with each other between a positive output end of the pair of differential output ends Tdout and the high-potential power source PH, and the other of the pair of sub-fifth transconductance resistor Rt' and the fifth transconductance transistor Qt5 are connected in series with each other between a negative output end of the pair of differential output ends Tdout and the high-potential power source PH. In some embodiments, the fifth transconductance circuit 245 further includes a transistor Qp4 and a voltage source VS1, wherein the transistor Qp4 and the voltage source VS1 serve to withstand the DC voltage PVDD which has a high voltage value (such as 20 volts), to prevent the fifth transconductance circuit 245 from being damaged.

In some embodiments, the fifth transconductance current Igm5 is proportional to the difference of the voltage of the high-potential power source PH (for example, the DC voltage PVDD) minus the output common-mode voltage Voutc and further minus the gate-source voltage Vgsp1 of the fifth transconductance transistor Qt5, and is inversely proportional to the feedback resistance Rf. In one embodiment, the current value of the fifth transconductance current Igm5 is shown as equation 6.

$$Igm5 = (PVDD - Vgsp1 - Voutc)/Rf \qquad \text{Equation 6:}$$

Figure 13B:
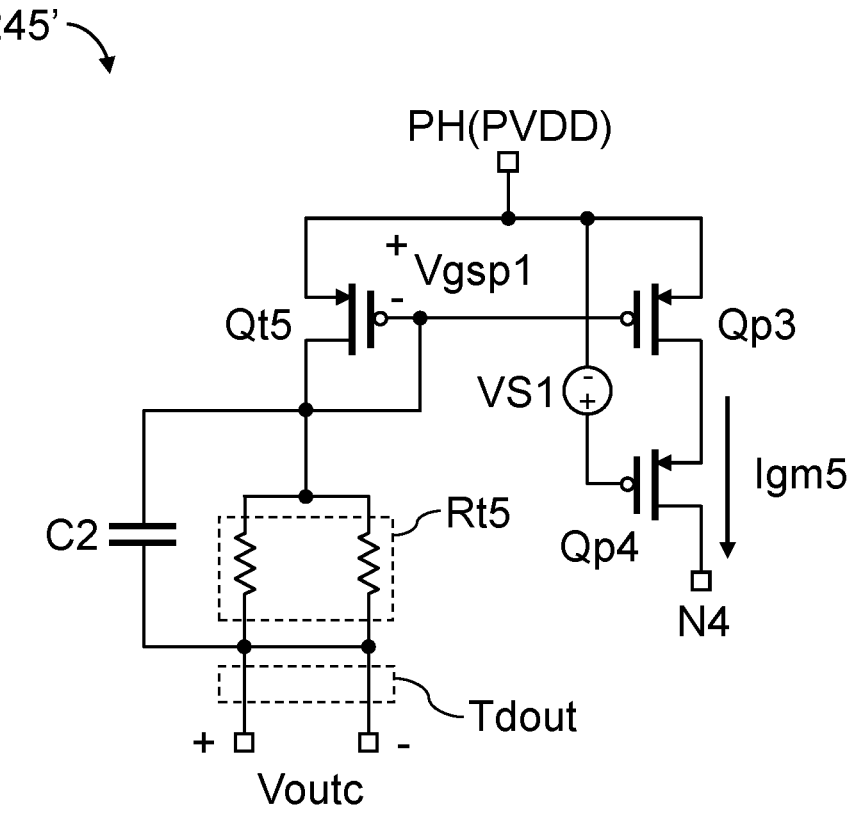
FIG. 13B is a schematic circuit diagram of the fifth transconductance circuit according to another embodiment of the present invention.

Please refer to FIG. 13B, which is a schematic circuit diagram of the fifth transconductance circuit 245' according to another embodiment of the present invention. The embodiment shown in FIG. 13B is different from the fifth transconductance circuit 245 shown in FIG. 13A in that a second capacitor C2 is coupled between the gate of the fifth transconductance transistor Qt5 of the fifth transconductance circuit 245' and the pair of the differential output ends Tdout, wherein the second capacitor C2 serves to eliminate the negative influence of the parasitic capacitance of the fifth transconductance transistor Qt5 at high frequencies.

Figure 14:
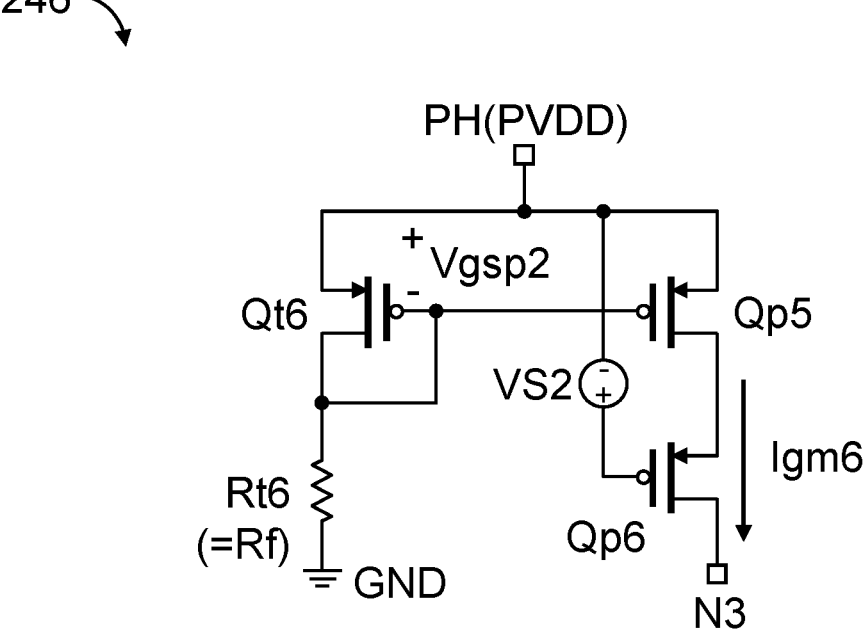
FIG. 14 is a schematic circuit diagram of the sixth transconductance circuit according to an embodiment of the present invention.

Please refer to FIG. 14. FIG. 14 is a schematic circuit diagram of the sixth transconductance circuit 246 according to an embodiment of the present invention. As shown in FIG. 14, the sixth transconductance circuit 246 includes a sixth transconductance resistor Rt6 and a sixth transconductance transistor Qt6, wherein the sixth transconductance resistor Rt6 and the sixth transconductance transistor Qt6 are configured as a non-operational-amplifier transconductance circuit for generating a sixth transconductance current Igm6 according to the DC voltage PVDD, wherein the sixth transconductance circuit 246 replicates and generates the sixth transconductance current Igm6 through a current mirror composed of a transistor Qp5 and the sixth transconductance transistor Qt6. In some embodiments, the resistance of the sixth transconductance resistor Rt6 is related to the feedback resistance Rf, for example as shown in FIG. 14, the resistance of the sixth transconductance resistor Rt6 is equal to the feedback resistance Rf. The sixth transconductance resistor Rt6 is coupled to the low-potential power source (for example, the ground potential GND shown in FIG. 14), and the sixth transconductance transistor Qt6 is coupled between the sixth transconductance resistor Rt6 and the high-potential power source PH. In some embodiments, the sixth transconductance circuit 246 further includes a transistor Qp6 and a voltage source VS2, wherein the transistor Qp6 and the voltage source VS2 serve to withstand the DC voltage PVDD which has a high voltage value (such as 20 volts), to prevent the sixth transconductance circuit 246 from being damaged.

In some embodiments, the sixth transconductance current Igm6 is proportional to the difference of the voltage of the high-potential power source PH (for example, the DC voltage PVDD) minus the voltage of the low-potential power source (for example, the ground potential GND with a voltage value of 0) and further minus a gate-source voltage Vgsp2 of the sixth transconductance transistor Qt6, and is inversely proportional to the feedback resistance Rf. In one embodiment, the current value of the sixth transconductance current Igm6 is shown as equation 7. In some embodiments, the operating bandwidth of the fourth transconductance circuit 244 is smaller than the operating bandwidths of the fifth transconductance circuit 245 and the sixth transconductance circuit 246, wherein the operating bandwidth of the fourth transconductance circuit 244 is related to the operating bandwidth of the second operational amplifier circuit OP2. The purpose of providing the sixth transconductance circuit 246 is to provide the gate-source voltage Vgsp2 of the sixth transconductance transistor Qt6 which is equal to the gate-source voltage Vgsp1 of the fifth transconductance transistor Qt5 under normal operation, so that when calculating the second common-mode control current Icm2, the fifth transconductance transistor sub-current of the fifth transconductance current Igm5 can be cancelled, which will be described later.

$$Igm6 = (PVDD - Vgsp2 - GND)/Rf = (PVDD - Vgsp2)/Rf \qquad \text{Equation 7:}$$

In some embodiments, the first transconductance transistor Qt1, the second transconductance transistor Qt2, the fifth transconductance transistor Qt5, and the sixth transconductance transistor Qt6 are all diode-coupled MOS transistors. The structure and function of a diode-coupled MOS transistor are well known to those with ordinary knowledge in the technical field to which the present invention pertains, and thus are not explained in detail herein.

In some embodiments, the second common-mode control current Icm2 is generated according to the linear operation of the fourth transconductance current Igm4, the fifth transconductance current Igm5, and the sixth transconductance current Igm6, wherein the fifth transconductance current Igm5 includes a second common-mode sub-transconductance current and a fifth transconductance transistor sub-current. The second common-mode sub-transconductance current is positively related to the output common-mode voltage Voutc (corresponding to Voutc/Rf in equation 6), and the fifth transconductance transistor sub-current is related to an electrical characteristic of the fifth transconductance transistor Qt5 (corresponding to Vgsp1/Rf in equation 6), wherein the sixth transconductance current Igm6 includes a sixth transconductance transistor sub-current (corresponding to Vgsp2/Rf in equation 7) which serves to cancel the fifth transconductance transistor sub-current (by setting the gate-source voltage Vgsp2 of the sixth transconductance transistor Qt6 to be equal to the gate-source voltage Vgsp1 of the fifth transconductance transistor Qt5). In some embodiments, the current value of the second common-mode control current Icm2 is shown as equation 8, wherein the fifth transconductance transistor sub-current of the fifth transconductance current Igm5 and the sixth transconductance transistor sub-current of the sixth transconductance current Igm6 cancel each other.

$$Icm2 = Igm5 - Igm6 + Igm4 =$$
$$\frac{PVDD - Vgsp1 - Voutc}{Rf} - \frac{PVDD - Vgsp2}{Rf} + \frac{Vcm}{Rf} \rightarrow$$

$$Icm2 = (Vcm - Voutc)/Rf$$

$$\text{Equation 8}$$

Figure 15:
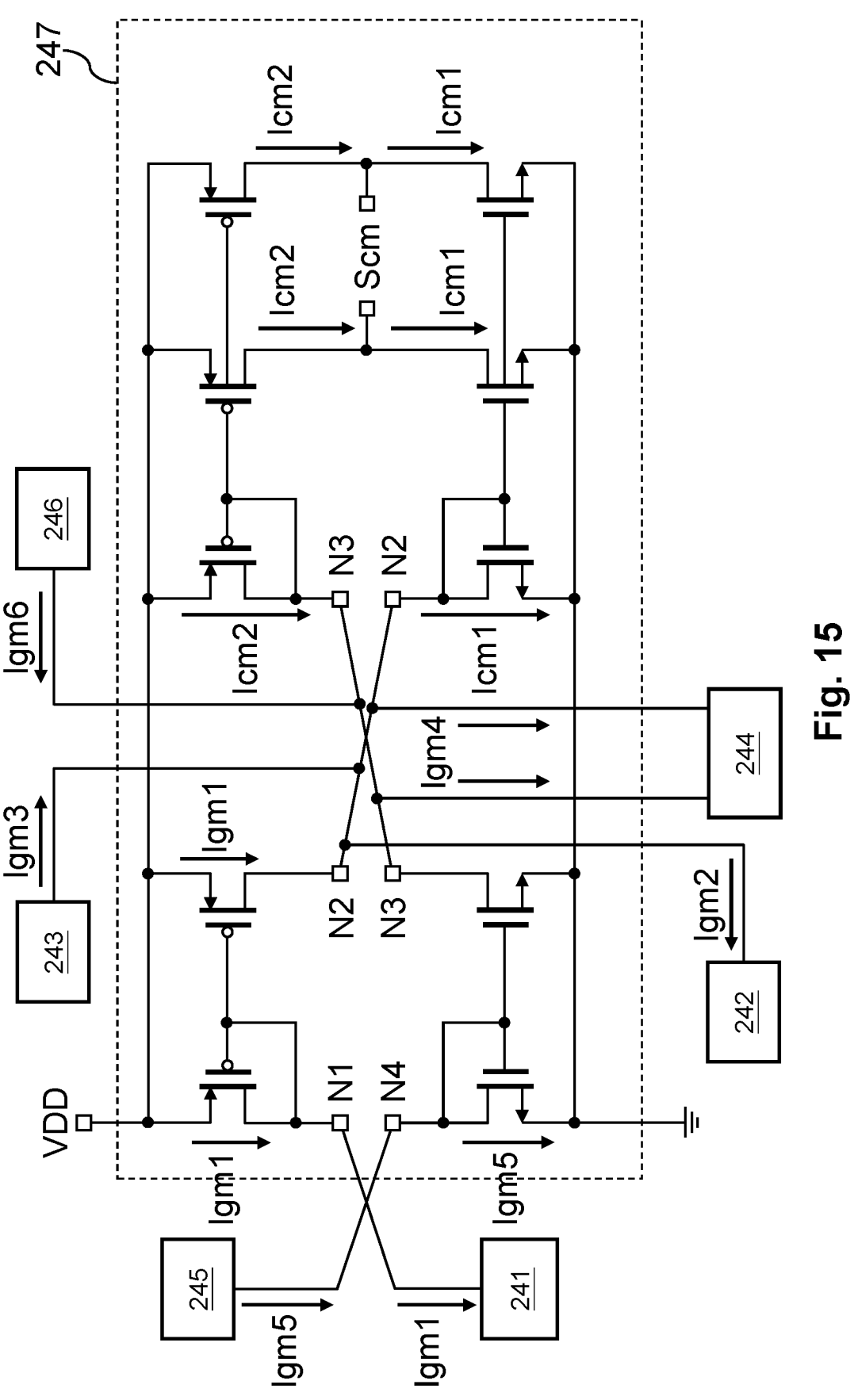
FIG. 15 is a schematic circuit diagram of a linear operation circuit according to an embodiment of the present invention.

In some embodiments, the common-mode control circuit 240 further includes a linear operation circuit 247 to perform linear operation on the first transconductance current Igm1, the second transconductance current Igm2, the third transconductance current Igm3, the fourth transconductance current Igm4, the fifth transconductance current Igm5, and the sixth transconductance current Igm6 to generate the first common-mode control current Icm1 and the second common-mode control current Icm2, whereby the common-mode control signal Scm is provided at the pair of differential input ends Tdin to regulate the input common-mode voltage Vicm of the differential input signal Sin at a predetermined input common-mode level Vcm. Please refer to FIG. 15. FIG. 15 is a schematic circuit diagram of the linear operation circuit 247 according to an embodiment of the present invention. As shown in FIG. 15, in some embodiments, the linear operation circuit 247 includes plural current mirrors composed of plural transistors, wherein the node N1 is coupled to the first transconductance circuit 241, the node N2 is coupled to the third transconductance circuit 243 and the fourth transconductance circuit 244, the node N3 is coupled to the fourth transconductance circuit 244 and the sixth transconductance circuit 246, and the node N4 is coupled to the fifth transconductance circuit 245.

In some embodiments, the linear operation circuit 247 performs a linear operation on the positive first transconductance current Igm1, the negative second transconductance current Igm2, the positive third transconductance current Igm3, and the negative fourth transconductance current Igm4 to generate the first common-mode control current Icm1 (as shown in equation 5), and when the output common-mode voltage Voutc is less than the predetermined input common-mode level Vcm, the current value of the first common-mode control current Icm1 is set to 0. In some embodiments, the linear operation circuit 247 performs a linear operation on the positive fifth transconductance current Igm5, the negative sixth transconductance current Igm6, and the positive fourth transconductance current Igm4 to generate the second common-mode control current Icm2, and when the output common-mode voltage Voutc is greater than the predetermined input common-mode level Vcm, the current value of the second common-mode control current Icm2 is set to 0.

Figure 16:
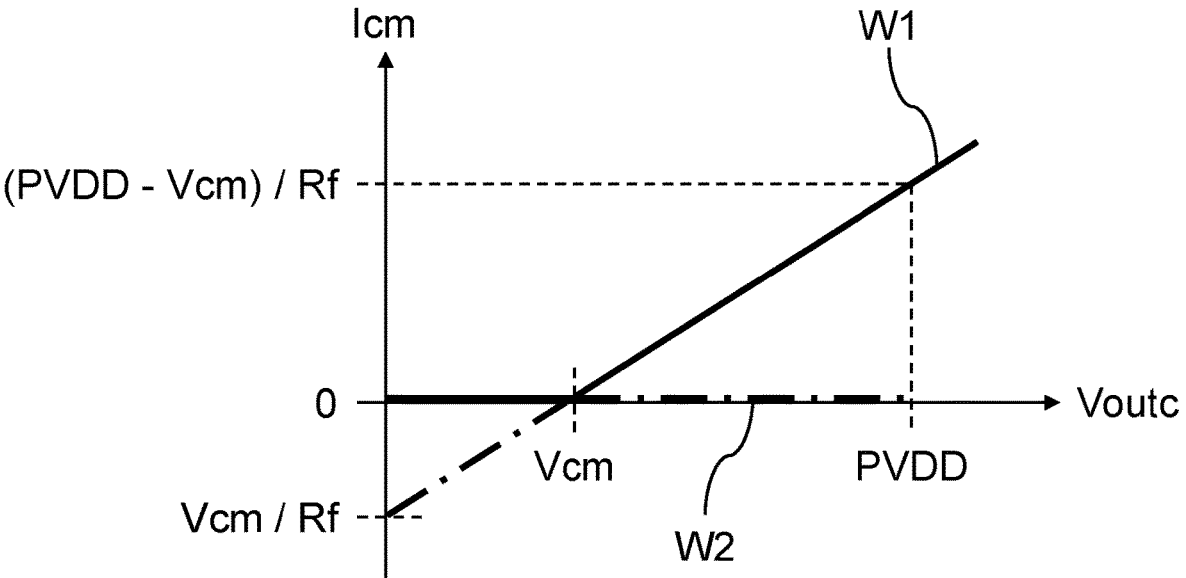
FIG. 16 is a schematic waveform diagram of the common-mode control current according to an embodiment of the present invention.

In some embodiments, when the output common-mode voltage Voutc is not less than the predetermined input common-mode level Vcm, the current value of the first common-mode control current Icm1 is a quotient obtained by dividing the difference between the output common-mode voltage Voutc and the predetermined input common-mode level Vcm by the feedback resistance Rf, and when the output common-mode voltage Voutc is less than the predetermined input common-mode level Vcm, the current value of the first common-mode control current Icm1 is 0 (as shown in equation 9). When the output common-mode voltage Voutc is not greater than the predetermined input common-mode level Vcm, the current value of the second common-mode control current Icm2 is the quotient obtained by dividing the difference between the predetermined input common-mode level Vcm and the output common-mode voltage Voutc by the feedback resistance Rf, and when the output common-mode voltage Voutc is greater than the predetermined input common-mode level Vcm, the current value of the second common-mode control current Icm2 is 0 (as shown in equation 10). Please refer to FIG. 16. FIG. 16 is a schematic waveform diagram of the common-mode control current Icm according to an embodiment of the present invention, wherein the waveform W1 is the first common-mode control current Icm1, and the waveform W2 is the second common-mode control current Icm2. As shown in FIG. 16, when the output common-mode voltage Voutc is not less than the predetermined input common-mode level Vcm, the common-mode control current Icm is dominated by the first common-mode control current Icm1 (waveform W1), and when the output common-mode voltage is Voutc is not greater than the predetermined input common-mode level Vcm, the first common-mode control current Icm1 is dominated by the second common-mode control current Icm2 (waveform W2). Therefore, regardless of the value of the output common-mode voltage Voutc, the common-mode control circuit 240 generates a corresponding common-mode control current Icm to cancel the currents generated by the output common-mode voltage Voutc of the differential output signal Sout that flows into the differential input ends Tdin through the feedback circuits 230A and 230B, thereby maintaining the input common-mode voltage Vicm at a low voltage constant value (i.e., the low voltage setting, which is for example, the predetermined input common-mode level Vcm).

$$\begin{cases} \text{if } Voutc \geq Vcm, Icm1 = (Voutc - Vcm)/Rf \\ \text{if } Voutc < Vcm, Icm1 = 0 \end{cases} \quad \text{Equation 9}$$

$$\begin{cases} \text{if } Voutc \leq Vcm, Icm2 = (Vcm - Voutc)/Rf \\ \text{if } Voutc > Vcm, Icm2 = 0 \end{cases} \quad \text{Equation 10}$$

To sum up, in the class-D amplifier circuit 20 of the present invention, the common-mode control circuit 240 generates the common-mode control current Icm to control the differential input signal Sin, so as to cancel a current generated by the output common-mode voltage Voutc of the differential output signal Sout that flows into the differential input ends Tdin through the feedback circuits 230A and 230B, thereby maintaining the input common-mode voltage Vicm at low voltage setting.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A class-D amplifier circuit, comprising:

an amplifier circuit, configured to receive a differential input signal at a pair of differential input ends, and amplifying and buffering the differential input signal to generate a differential relay signal;

a pulse width modulation (PWM) circuit, configured to generate a PWM signal by pulse width modulation according to the differential relay signal;

a power stage circuit, configured to switch a plurality of switches of the power stage circuit according to the PWM signal to generate a differential output signal at a pair of differential output ends;

a pair of feedback circuits correspondingly coupled between the pair of differential input ends and the pair of differential output ends, wherein the feedback circuits have a same feedback resistance; and a common-mode control circuit, configured to control one of a first high-bandwidth transconductance circuit and a second high-bandwidth transconductance circuit according to an output common-mode voltage of the differential output signal to correspondingly generate a first common-mode control current and a second common-mode control current, so as to provide a common-mode control signal at the pair of differential input ends to regulate an input common-mode voltage of the differential input signal at a predetermined input common-mode level;

wherein when the output common-mode voltage is not less than the predetermined input common-mode level, a current value of the first common-mode control current is a quotient obtained by dividing a difference between the output common-mode voltage and the predetermined input common-mode level by the feedback resistance, and when the output common-mode voltage is less than the predetermined input common-mode level, the current value of the first common-mode control current is zero;

wherein when the output common-mode voltage is not greater than the predetermined input common-mode level, a current value of the second common-mode control current is a quotient obtained by dividing a difference between the predetermined input common-mode level and the output common-mode voltage by the feedback resistance, and when the output common-mode voltage is greater than the predetermined input common-mode level, the current value of the second common-mode control current is zero.

2. The class-D amplifier circuit of claim 1, wherein the first high-bandwidth transconductance circuit comprises:

a first transconductance circuit, including a first transconductance resistor and a first transconductance transistor, wherein the first transconductance resistor and the first transconductance transistor are configured as a first non-operational-amplifier transconductance circuit for generating a first transconductance current according to the differential output signal;

a second transconductance circuit, including a second transconductance resistor and a second transconductance transistor, wherein the second transconductance resistor and the second transconductance transistor are configured as a second non-operational-amplifier transconductance circuit for generating a second transconductance current according to a direct-current (DC) voltage;

a third transconductance circuit, including a first operational amplifier circuit, a third transconductance transistor, and a third transconductance transistor, and a third transconductance resistor, wherein the first operational amplifier circuit, the third transconductance transistor, and the third transconductance resistor are configured to generate a third transconductance current according to a first reference voltage by feedback mechanism, wherein the first reference voltage is related to the DC voltage; and a fourth transconductance circuit, including a second operational amplifier circuit, a fourth transconductance transistor, and a fourth transconductance resistor, wherein the second operational amplifier circuit, the fourth transconductance transistor, and the fourth transconductance resistor are configured to generate a fourth transconductance current according to a second reference voltage by feedback mechanism, wherein the second reference voltage is related to the predetermined input common-mode level;

wherein the first common-mode control current is generated according to a linear operation among the first transconductance current, the second transconductance current, the third transconductance current, and the fourth transconductance current;

wherein the first transconductance current includes a first common-mode sub-transconductance current and a first transconductance transistor sub-current, wherein the first common-mode sub-transconductance current is positively related to the output common-mode voltage, and the first transconductance transistor sub-current is related to an electrical characteristic of the first transconductance transistor, wherein the second transconductance current includes a second transconductance transistor sub-current which serves to cancel the first transconductance transistor sub-current.

3. The class-D amplifier circuit of claim 2, wherein an operating bandwidth of the third transconductance circuit is smaller than operating bandwidths of the first transconductance circuit and the second transconductance circuit, wherein the operating bandwidth of the third transconductance circuit is related to an operating bandwidth of the first operational amplifier circuit.

4. The class-D amplifier circuit of claim 2, wherein the second high-bandwidth transconductance circuit comprises:

the fourth transconductance circuit;

a fifth transconductance circuit, including a fifth transconductance resistor and a fifth transconductance transistor, wherein the fifth transconductance resistor and the fifth transconductance transistor are configured as a third non-operational-amplifier transconductance circuit for generating a fifth transconductance current according to the differential output signal; and a sixth transconductance circuit, including a sixth transconductance resistor and a sixth transconductance transistor, wherein the sixth transconductance resistor and the sixth transconductance transistor are configured as a fourth non-operational-amplifier transconductance circuit for generating a sixth transconductance current according to the DC voltage;

wherein the second common-mode control current is generated according to a linear operation among the fourth transconductance current, the fifth transconductance current, and the sixth transconductance current;

wherein the fifth transconductance current includes a second common-mode sub-transconductance current and a fifth transconductance transistor sub-current, wherein the second common-mode sub-transconductance current is positively related to the output common-mode voltage, and the fifth transconductance transistor sub-current is related to an electrical characteristic of the fifth transconductance transistor, wherein the sixth transconductance transistor current includes a sixth transconductance transistor sub-current which serves to cancel the fifth transconductance transistor sub-current.

5. The class-D amplifier circuit of claim 4, wherein an operating bandwidth of the fourth transconductance circuit is smaller than operating bandwidths of the fifth transconductance circuit and the sixth transconductance circuit, wherein the operating bandwidth of the fourth transconductance circuit is related to an operating bandwidth of the second operational amplifier circuit.

6. The class-D amplifier circuit of claim 4, wherein the common-mode control circuit further comprises a linear operation circuit for performing linear operation on the first transconductance current, the second transconductance current, the third transconductance current, the fourth transconductance current, the fifth transconductance current, and the sixth transconductance current to generate the first common-mode control current, the second common-mode control current, and the common-mode control signal.

7. The class-D amplifier circuit of claim 2, wherein a resistance of the first transconductance resistor is related to the feedback resistance, and the first transconductance resistor comprises a pair of sub-first transconductance resistors correspondingly coupled to the pair of differential output ends, and the first transconductance transistor is coupled between the first transconductance resistor and a low-potential power source;

wherein a resistance of the second transconductance resistor is related to the feedback resistance, and the second transconductance resistor is coupled to a high-potential power source, and the second transconductance transistor is coupled between the second transconductance resistor and the low-potential power source, wherein the voltage of the high-potential power source is related to the DC voltage;

wherein a resistance of the third transconductance resistor is related to the feedback resistance, and the third transconductance resistor is coupled between the first operational amplifier circuit and the low-potential power source; and wherein a resistance of the fourth transconductance resistor is related to the feedback resistance, and the fourth transconductance resistor is coupled between the second operational amplifier circuit and the low-potential power source.

8. The class-D amplifier circuit of claim 4, wherein a resistance of the fifth transconductance resistor is related to the feedback resistance, and the fifth transconductance resistor includes a pair of sub-fifth transconductance resistors correspondingly coupled to the pair of differential output ends, and the fifth transconductance transistor is coupled between the fifth transconductance resistor and a high-potential power source, wherein the voltage of the high-potential power source is related to the DC voltage; and wherein a resistance of the sixth transconductance resistor is related to the feedback resistance, and the sixth transconductance resistor is coupled to a low-potential power source, and the sixth transconductance transistor is coupled between the sixth transconductance resistor and the high-potential power source.

9. The class-D amplifier circuit of claim 7, wherein the first transconductance current is proportional to a difference of the output common-mode voltage minus the voltage of the low-potential power source and further minus a gate-source voltage of the first transconductance transistor, and is inversely proportional to the feedback resistance;

wherein the second transconductance current is proportional to a difference of the voltage of the high-potential power source minus the voltage of the low-potential power source and further minus a gate-source voltage of the second transconductance transistor, and is inversely proportional to the feedback resistance;

wherein the third transconductance current is proportional to the voltage of the high-potential power source, and is inversely proportional to the feedback resistance;

wherein the fourth transconductance current is proportional to the predetermined input common-mode level and is inversely proportional to the feedback resistance;

wherein the fifth transconductance current is proportional to the difference of the voltage of the high-potential power source minus the output common-mode voltage and further minus a gate-source voltage of the fifth transconductance transistor, and is inversely proportional to the feedback resistance; and wherein the sixth transconductance current is proportional to a difference of the voltage of the high-potential power source minus the voltage of the low-potential power source and further minus a gate-source voltage of the sixth transconductance transistor, and is inversely proportional to the feedback resistance.

10. The class-D amplifier circuit of claim 9, wherein the second transconductance current includes a second sub-transconductance current, and a component of the third transconductance current which is related to a voltage of the high-potential power source and a component of the second sub-transconductance current which is related to the voltage of the high-potential power source cancel each other;

wherein the fifth transconductance current includes a fifth sub-transconductance current and the sixth transconductance current includes a sixth sub-transconductance current, and a component of the fifth transconductance current which is related to the voltage of the high-potential power source and a component of the sixth sub-transconductance current which is related to the voltage of the high-potential power source cancel each other.

11. The class-D amplifier circuit of claim 7, wherein one of the pair of sub-first transconductance resistors and the first transconductance transistor are connected in series with each other between a positive output end of the pair of differential output ends and the low-potential power source, and the other of the pair of sub-first transconductance resistors and the first transconductance transistor are connected in series with each other between a negative output end of the pair of differential output ends and the low-potential power source.

12. The class-D amplifier circuit of claim 8, wherein one of the pair of sub-fifth transconductance resistors and the fifth transconductance transistor are connected in series with each other between a positive output end of the pair of differential output ends and the high-potential power source, and the other of the pair of sub-fifth transconductance resistors and the fifth transconductance transistor are connected in series with each other between a negative output end of the pair of differential output ends and the high-potential power source.

13. The class-D amplifier circuit of claim 7, wherein the first transconductance transistor and the second transconductance transistor are both diode-coupled MOS transistors.

14. The class-D amplifier circuit of claim 8, wherein the fifth transconductance transistor and the sixth transconductance transistor are both diode-coupled MOS transistors.

15. The class-D amplifier circuit of claim 6, wherein the fourth transconductance circuit further comprises a current mirror circuit, and the current mirror circuit is coupled with the fourth transconductance transistor to replicate the fourth transconductance current, for providing the fourth transconductance current to the linear operation circuit.

16. The class-D amplifier circuit of claim 2, wherein a first capacitor is coupled between a gate of the first transconductance transistor and the pair of differential output ends.

17. The class-D amplifier circuit of claim 4, wherein a second capacitor is coupled between a gate of the fifth transconductance transistor and the pair of differential output ends.

18. The class-D amplifier circuit of claim 9, wherein the linear operation circuit performs linear operation on the first transconductance current in positive sign, the second transconductance current in negative sign, the third transconductance current in positive sign, and the fourth transconductance current in negative sign to generate the first common-mode control current, and when the output common-mode voltage is less than the predetermined input common-mode level, the current value of the first common-mode control current is set to zero.

19. The class-D amplifier circuit of claim 9, wherein the linear operation circuit performs linear operation on the fifth transconductance current in positive sign, the sixth transconductance current in negative sign, and the fourth transconductance current in positive sign to generate the second common-mode control current, and when the output common-mode voltage is greater than the predetermined input common-mode level, the current value of the second common-mode control current is set to zero.

* * * * *